United States Patent
Stellick et al.

(10) Patent No.: US 9,578,784 B2
(45) Date of Patent: Feb. 21, 2017

(54) RACK AIRFLOW CONDUIT

(71) Applicants: Allied Telesis Holdings Kabushiki Kaisha, Tokyo (JP); ALLIED TELESIS, INC., Bothell, WA (US)

(72) Inventors: Daniel Stellick, Geneva, IL (US); Timothy Hopkins, Campbell, CA (US); Erics Lai, Menlo Park, CA (US)

(73) Assignee: ALLIED TELESIS HOLDINGS KABUSHIKI KAISHA, Tokyo (JP)

( * ) Notice: Subject to any disclaimer, the term of this patent is extended or adjusted under 35 U.S.C. 154(b) by 40 days.

(21) Appl. No.: 14/527,131

(22) Filed: Oct. 29, 2014

(65) Prior Publication Data

US 2016/0128226 A1  May 5, 2016

(51) Int. Cl.
*H05K 7/20* (2006.01)

(52) U.S. Cl.
CPC ............................ *H05K 7/20727* (2013.01)

(58) Field of Classification Search
CPC ............................ H05K 7/206; H05K 7/20545
USPC ....... 361/679.46, 679, 679.5; 312/205, 265.1
See application file for complete search history.

(56) References Cited

U.S. PATENT DOCUMENTS

| | | | | |
|---|---|---|---|---|
| 7,222,043 | B2 * | 5/2007 | Augustin | G01R 31/2862 324/750.03 |
| 2004/0080244 | A1 * | 4/2004 | Lowther, Jr. | A47B 45/00 312/205 |
| 2006/0158833 | A1 * | 7/2006 | Belady | H05K 7/1492 361/679.4 |
| 2010/0321874 | A1 * | 12/2010 | Bhattacharyya | H05K 7/20736 361/679.5 |
| 2012/0229971 | A1 * | 9/2012 | Mills | H05K 7/1489 361/679.46 |
| 2013/0342991 | A1 * | 12/2013 | Sun | G06F 1/20 361/679.46 |

\* cited by examiner

*Primary Examiner* — Dion R Ferguson
*Assistant Examiner* — Mandeep S Buttar
(74) *Attorney, Agent, or Firm* — Brooks Acordia IP Law, P.C.; Michael Zarrabian

(57) ABSTRACT

Provided is an apparatus including a frame a conduit coupled to the frame. The conduit is configured to adjustably extend from the frame, thereby providing a channel between the frame and a side of the server rack. The channel is configured to substantially thermally isolate a flow of gas through the channel.

20 Claims, 4 Drawing Sheets

RACK AIRFLOW CONDUIT

BACKGROUND

Server systems operate as part of a client-server architecture and serve the requests of a client system by performing some computing tasks on behalf of the client system. Example server computing systems include database, file, mail, print, application, web, gaming servers, etc. Server computing systems often run for long periods without interruption and the expectation of server system availability is often very high, making reliability and durability of the server components extremely important. To maintain maximum reliability of the server components, the server components are generally kept within a specified temperature range.

The server components of a server computing system may be organized and mounted into server racks that are commonly used throughout various industries, e.g., audio, video, telecommunication, computing, entertainment, etc. Server components may be configured to receive cold air at the front side of the server rack and exhaust hot air from the back side of the server rack to maintain a suitable temperature environment within the server rack. Server components operate in a temperature controlled environment because for every 1° C. temperature increase, the life expectancy of the server components may be reduced in half. As the need for information has increased, so has the processing power of the server components, thereby resulting in increasingly higher processor densities and heat levels within server racks.

SUMMARY

Accordingly, a need has arisen for a solution to allow improved cooling of server components in a server computing system environment. Further, there is a need to improve the stability of the ambient temperature of server components mounted within a rack unit. For example, an improved temperature environment for server components may be realized by thermally coupling cool air from a cold aisle to a back side of a frame of a rack unit housing the server component.

According to some embodiments, a rack unit includes a frame with mounting brackets mounted to a front side of the frame. The brackets are configured to mount the frame to a server rack. The conduit may be coupled to a back side of the frame and configured to adjustably extend from the frame. The conduit is configured to substantially thermally isolate air within the conduit from air within the server rack.

According to some embodiments, a rack unit includes a frame and a conduit that is coupled to the frame. The conduit is configured to extend from the frame and providing a channel between the frame and a side of the server rack. The channel is configured to substantially thermally isolate a flow of gas through the channel.

According to some embodiments, rack unit includes a frame is configured for mounting within a server rack. The rack unit also includes means for thermally isolating a first volume of gas within the frame from a second volume of gas within the first server rack. For example, the means may include nested sleeve elements that are configured to extend an adjustable distance from the frame. As another example, the means may include panels that are mounted on a number of rails. Furthermore, the means may be configured to extend an adjustable distance from the frame.

These and other features and aspects may be better understood with reference to the following drawings, description, and appended claims.

DETAILED DESCRIPTION

Figure 1:
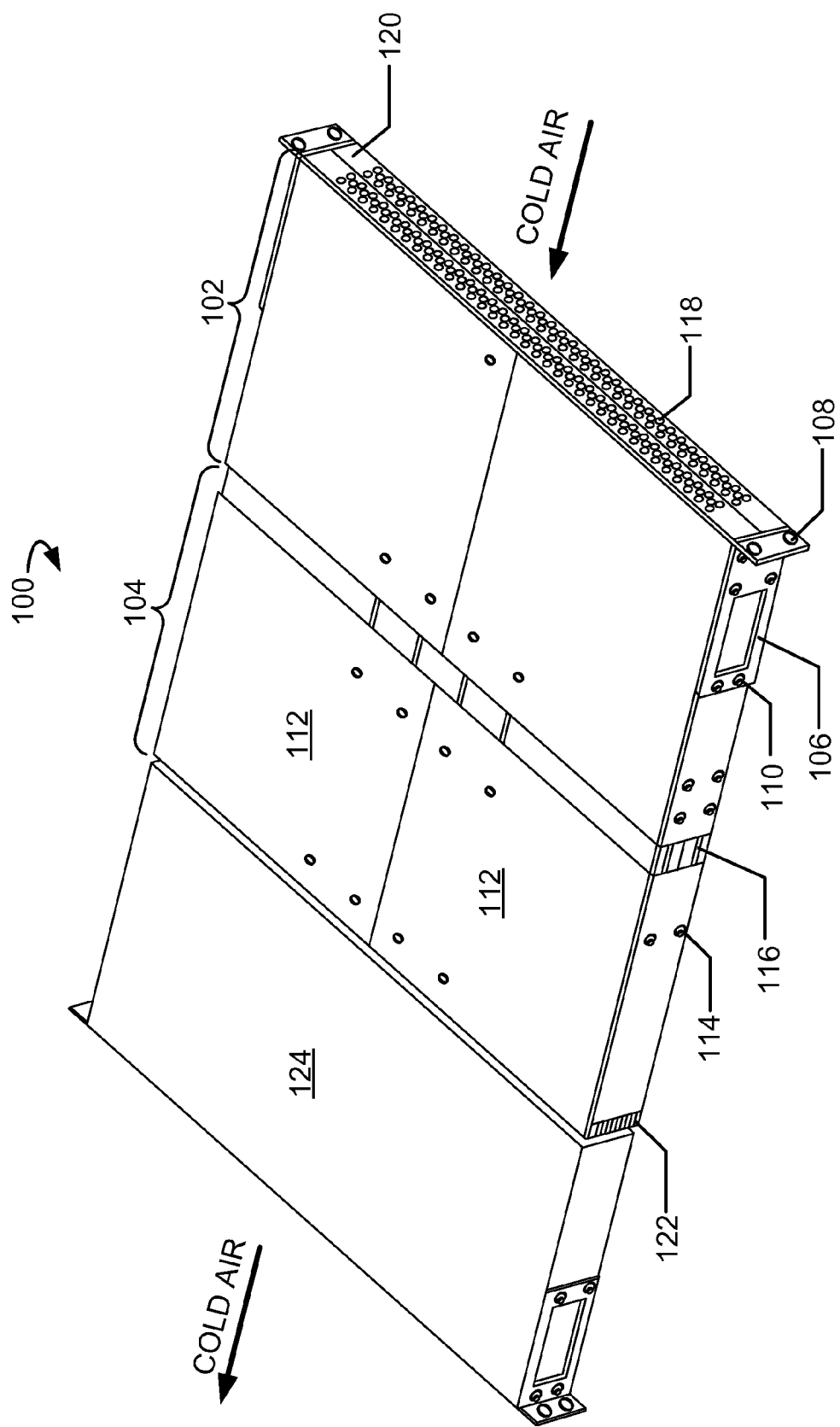
FIG. 1 illustrates a rack unit with a size adjustable conduit according to some embodiments.

Reference will now be made in detail to various embodiments, examples of which are illustrated in the accompanying drawings. While the claimed embodiments will be described in conjunction with various embodiments, it will be understood that these various embodiments are not intended to limit the scope of the embodiments. On the contrary, the claimed embodiments are intended to cover alternatives, modifications, and equivalents, which may be included within the scope of the appended Claims. Furthermore, in the following detailed description, numerous specific details are set forth in order to provide a thorough understanding of the claimed embodiments. However, it will be evident to one of ordinary skill in the art that the claimed embodiments may be practiced without these specific details. In other instances, well known methods, procedures, components, and circuits are not described in detail so that aspects of the claimed embodiments are not obscured.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Herein, reference to a rack unit (RU) may refer to the mounting frame that holds a server component or a unit of measure that describes a dimension, e.g., height, of a server component, as appropriate. Furthermore, reference to a front side or back side of a rack unit may refer to a front side or back side defined by a frame of the rack unit, respectively. In some embodiments, rack unit may include a frame or enclosure for mounting server components.

Provided herein are embodiments for improving the cooling air flow to electronic equipment mounted in a rack unit of a server rack. One or more server components mounted within the server rack may be unable to draw in air from a cool air zone due to the mounting location and depth of the server component. For example, a server component may be rear mounted within the server rack such that the front side of the server component is aligned to the back side of the server rack and the back side of the server component may face the front side of the server rack. Furthermore, depending on the depth of the server component, the rear mounted server component may not extend into the cool air zone. The inability to draw in air from the cool air zone may lead to a reduced life span of the server component.

Networking components, e.g., network switches, routers, etc., may connect or network other server components mounted within a server rack to a computer network, e.g., Internet, Ethernet, etc. Furthermore, networking ports located at the rear of some server components may be connected to networking ports located at the front side of the networking components through networking cables. To facilitate the cabling between the networking components and the other server components mounted in a server rack, the networking components may be mounted such that the front or port side of the networking components is aligned with the back side of the server rack and the back or power side of the networking component facing the front side of the server rack. To compensate for the rear mounting, a networking component may operate in a reverse air flow configuration, such that air may be drawn in from the back side of the network component facing the front of the server rack and exhausted through the front side of the network component facing the back side of the server rack.

Depending on the depth of the networking component, the air intake of a rear mounted networking component may be located within a hot air zone of the server rack. In some embodiments, a rack unit includes a conduit that is extendable to a size adjustable length. Use of the size adjustable conduit facilitates thermal isolation of the air intake of the networking component from the hot air zone of the server rack and provides a channel between the cool air zone of the server rack and the air intake of the networking component. The rack unit may be fastened to the front side or back side of the server rack and the size adjustable conduit extended to the back side or front side of the server rack depending on whether the rack unit is rear mounted or front mounted, respectively, to the server rack. In some embodiments, air from a cool air zone may be conducted to the air intake of the networking component without increasing the profile of the rack unit, e.g., a rack unit height within one RU or 1.75 inches.

FIG. 1 illustrates a rack unit with a size adjustable conduit according to some embodiments. Although this disclosure illustrates and describes size adjustable conduits with example configurations of extending elements, this disclosure contemplates and includes size adjustable conduits with any suitable configuration of extension elements. Rack unit 100 may include a frame 102, size adjustable conduit 104, and mounting brackets 106. Frame 102 may define a two-dimensional (2D) cross-section which is equal to a server component 124. Mounting brackets 106 may be an L-shaped bracket with one end of mounting bracket 106 fastened to frame 102 and the other end of mounting bracket 106 having mounting holes 108 that are spaced to align with corresponding mounting holes of the mounting posts of the server rack. Mounting holes 108 are configured to receive a frame fastener 110, e.g., screw, bolt, cage nut, etc. to mount frame 102 of rack unit 100 to a server rack.

The depth of rack unit 100 is modified by adjusting the length of size adjustable conduit 104. In some embodiments, size adjustable conduit 104 may include one or more sliding sleeve elements 112 that extend or telescope from frame 102. For example, sliding sleeve element 112 may be a single piece sleeve, such as an injection molded sleeve made from plastic. As another example, sliding sleeve element 112 may be a sleeve with multiple elements that are fastened in place by positioning screws 114. In some embodiments, multiple sets of sleeve elements 112 may be nested within each other, such that the total thickness of size adjustable conduit 104 and the height of frame 102 conform to an industry standard RU, e.g., 1.75 inches.

In some embodiments, sliding sleeve elements 112 may be supported by a rail structure with grooves 116. The rail structure may include side panels and may be configured so that sleeve elements 112 overlay across the top and bottom of the rail structure. Furthermore, the position of sleeve elements 112 may be set in place through the use of one or more positioning screws 114 that may be tightened into corresponding grooves 116. Sleeve elements 112 in conjunction with side panels or the rail structure define a volume of size adjustable conduit 104 in which air may between from the distal end of size adjustable conduit 104 to the back side of frame 102.

In some embodiments, rack unit 100 may include a face plate 120 that is perforated with ventilation holes 118, such that cold air from the cold air zone may be channeled from rack unit 100. In some embodiments, size adjustable conduit 104 may include one or more entry points or openings 122 that allow for cables, e.g., power cords, network cables, etc. to be coupled to the server component 124, whilst providing isolation between server component 124 mounted behind rack unit 100 and cold air flow from other rack units within the server rack. As an example, entry point 122 may be fabricated in the distal portion of size adjustable conduit 104. Cable entry point 122 may include a cover plate with cutouts sized for one or more cables. In some instances, the cover plate may be fabricated using metal, plastic, PVC, fiberglass, etc. In another instance, the cover plate may be a panel of an elastically deformable material, e.g., rubber, elastomer, etc., with a slit where the cables are passed through. As an example, the cover plate may include multiple panels separated by a gap configured to allow cables to be passed through. In some embodiments, cable entry point 122 may be oriented in a vertical direction. In other embodiments, cable entry point 122 may be oriented in a horizontal direction.

As described above, server component 124 may be a networking component, e.g., router, switch, hub, etc. The networking component may be mounted to the back side of the server rack using mounting brackets 106 and operate in a reverse air flow configuration. Size adjustable conduit 104 may be extended such that the distal end of size adjustable conduit 104 is substantially aligned to the back side of server component 124. In this configuration, cool air may be drawn in through frame 102 to the power side of the network component. In addition, extending size adjustable conduit 104 thermally isolates the networking component from the hot air zone within the server rack. As described above, maintaining a constant temperature environment is an important factor determining the reliability of server component 124 and the use of size adjustable conduit 104 facilitates maintaining a constant temperature environment for the networking component.

Figure 2:
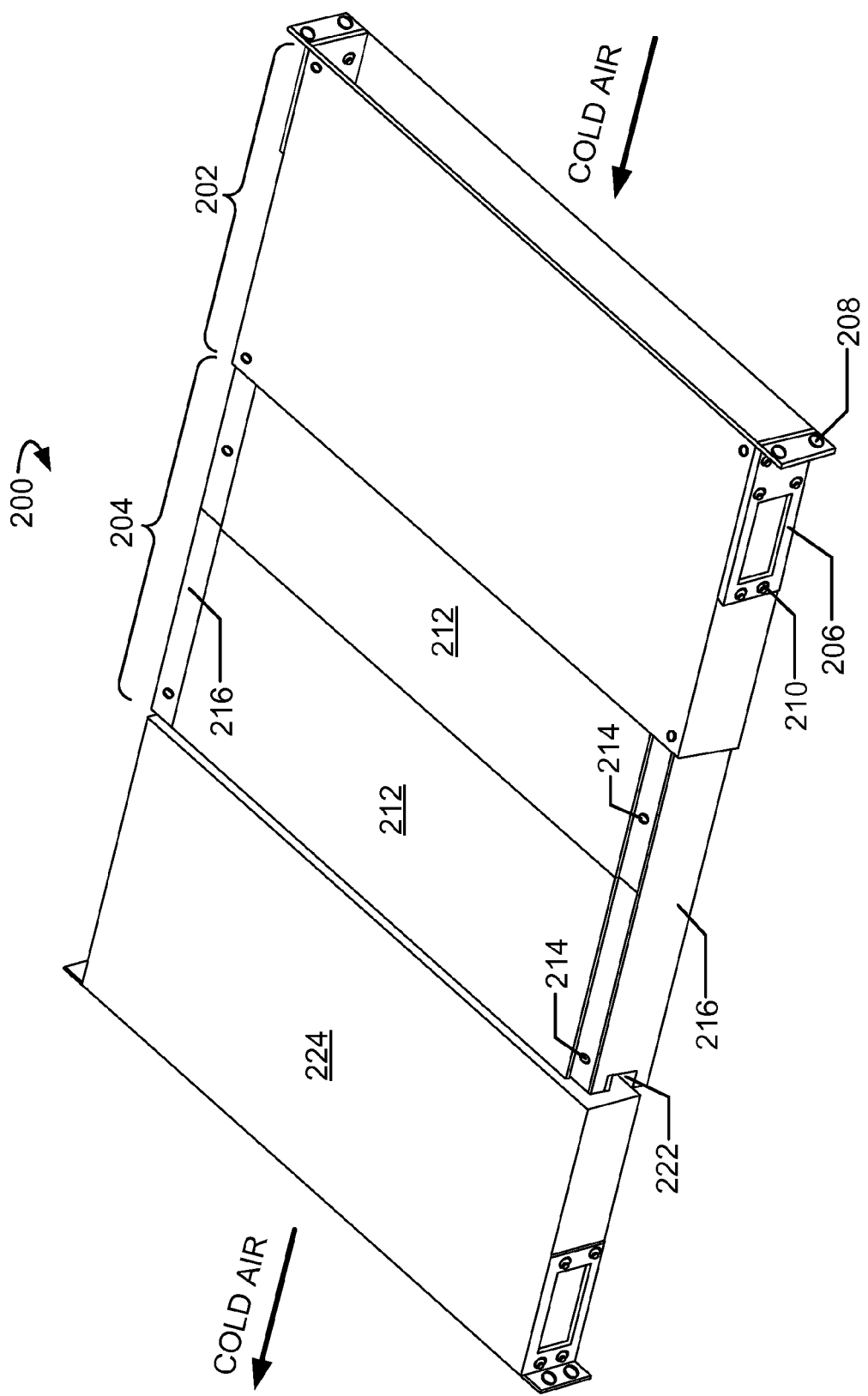
FIG. 2 illustrates another rack unit with a size adjustable conduit according to some embodiments.

FIG. 2 illustrates another rack unit with a size adjustable conduit according to some embodiments. Rack unit 200 may include a frame 202, size adjustable conduit 204, and mounting brackets 206. As described above, mounting brackets 206 may be an L-shaped bracket with one end of mounting bracket 206 bolted to frame 202 and the other end of mounting bracket 206 having mounting holes 208 that are positioned to align with corresponding mounting holes of mounting posts of the server rack. Mounting holes 208 are configured to receive a mounting fastener e.g., screw, bolt, cage nut, etc. to mount frame 202 of rack unit 200 to the server rack.

The depth of rack unit 200 is modifiable by adjusting the distance that size adjustable conduit 204 extends from the back side of frame 202. Although this disclosure illustrates and describes example methods of positioning a size adjustable conduit relative to a back side of a server component, this disclosure contemplates any suitable methods of positioning size adjustable conduits, such as position fasteners or pegs being placed in the holes of a rail, etc. In some embodiments, size adjustable conduit 204 may include rails 216 and one or more panels 212 may be set in place on rails 216 through the use of one or more positioning screws 214. In other embodiments, size adjustable conduit 204 may include side panels attached to rails 216. Rails 216 may include side panels and may be configured so that panels 212 overlay across the top and bottom of rails 216. In some embodiments, rails 216 may include a rail fixed in position with frame 202 and corresponding movable rail that is supported by the fixed rail. Panels 212 in conjunction with side panels or rails 216 define a volume of size adjustable conduit 204 in which cold air may flow from frame 202 to size adjustable conduit 204.

The moveable rail of rails 216 may extend out from frame 202, thereby moving size adjustable conduit 204 into position. In some embodiments, size adjustable conduit 204 may be a fixed length and the distance that size adjustable conduit 204 extends from the back side of frame 202 may be modified by moving size adjustable conduit 204 along rails 216. The length of rails 216 and size adjustable conduit 204 may be set through a locking mechanism (not shown) integrated with rails 216. In one instance, a locking mechanism may be a spring-loaded peg that locks into a hole in rails 216, thereby locking rails 216 in position.

In some embodiments, server component 224 may be a networking component, e.g., router, switch, hub, etc. The reliability of server component 224 is enhanced by maintaining a constant temperature environment. As described above, the air intake of a networking component may be located within a hot air zone of the server rack due to the lack of depth of the networking component. Size adjustable conduit 204 facilitates maintaining a constant temperature environment for the networking component by providing a conduit that allows air outside of the server rack to flow to the air intake of the networking component. For example, size adjustable conduit 204 may be positioned such that an end of size adjustable conduit 204 is substantially aligned to a side of the server rack, such that cooling air may flow in through size adjustable conduit 204 and cool the electronics of the networking component. The heated air may then be exhausted through the other side of the server rack.

In some embodiments, size adjustable conduit 204 may include multiple panels 212 that are fastened in place to rails 216 by positioning screws 214. As another example, panels 212 may be constructed as a single piece of plastic or metal that covers a top surface and bottom surface defined by rails 216. Panels 212 in conjunction with side panels or rails 216 define a volume of size adjustable conduit 204. In some embodiments, size adjustable conduit 204 may be nested within frame 202, such that the total thickness of size adjustable conduit 204 and the height of frame 202 conform to an industry standard RU. In some embodiments, the extension distance of size adjustable conduit 204 may be modified by adding or removing panels 212. As another example, the distance of size adjustable conduit 204 may be modified by swapping panels 212 of different lengths.

As described above, size adjustable conduit 204 may include an opening 222 that allows for cables, e.g., power cords, networking cables, etc. to be coupled to server component 224 housed behind rack unit 200, whilst providing isolation between server component 224 mounted to the back of the server rack and cold air flow from the front of the server rack to the back of the server rack. In high availability server designs, server components 224 may include redundant power, so that server component 224 may remain operational in the event of a failure of power supply unit (PSU) of server component 224. For example, a networking switch may use two PSUs, so that the networking switch may continue to operate in the event of a failure of one of the PSUs. Opening 222 of size adjustable conduit 204 may be configured to accommodate single or dual power cables for server components 224 with single or dual PSUs, respectively.

Figure 3:
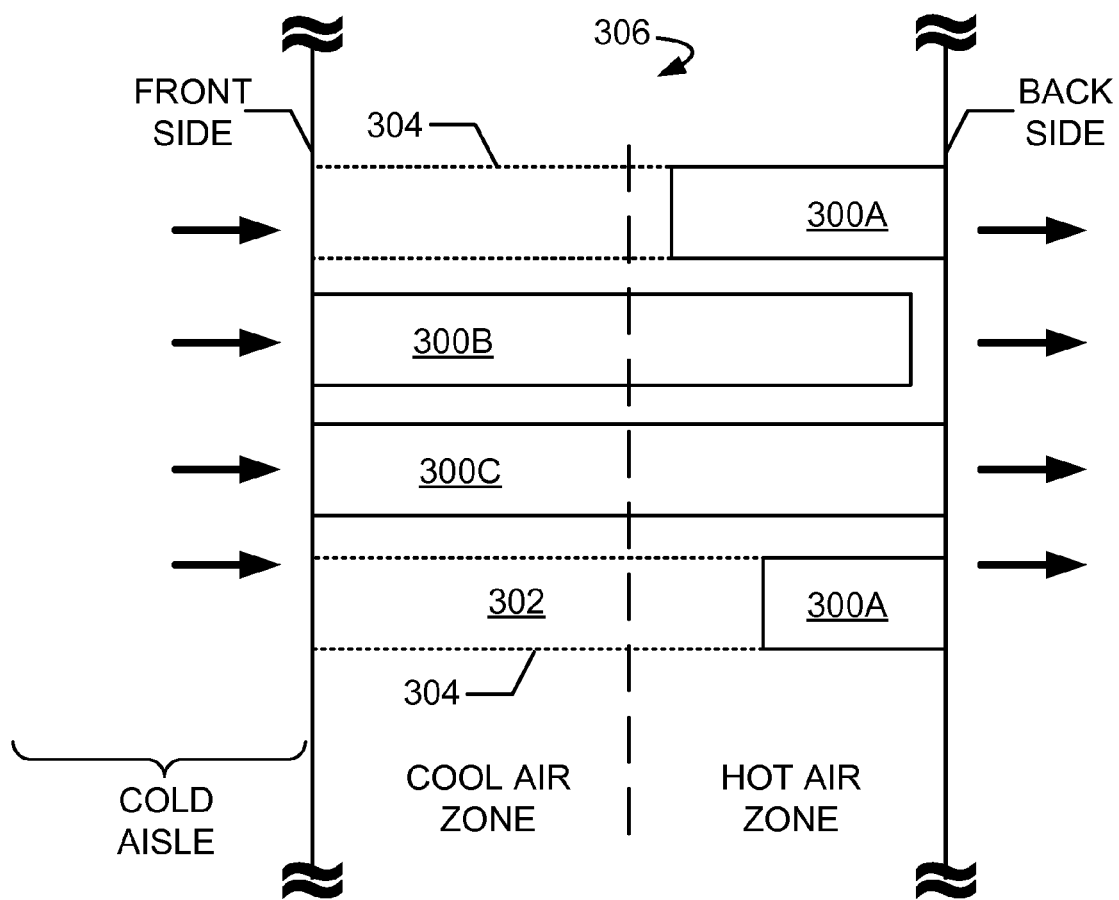
FIG. 3 illustrates a server rack with a size adjustable conduit according to some embodiments.

FIG. 3 illustrates a server rack with a size adjustable conduit according to some embodiments. Server components may include networking components, power supplies, processor motherboards, storage components, specialize components, etc. Example storage components may include a hard-disk drive (HDD), solid-state drive (SSD), hybrid drives that include both HDD and SSD, etc. Example specialized components include graphics, processing systems, etc. As described above, server components may be mounted within server rack 306 using rack units 300A-C. A server computing system may be configured as one or more server racks 306 that provide structural, electrical, networking, temperature control support, etc. for the server components mounted within each server rack 306.

Rack units 300A-C may include a frame to support the server components and with physical dimensions, e.g., height, width, etc., that conform to industry standards. In some embodiments, a height of rack units 300A-C may be standardized to multiples of 1.75 inches or one RU. In other embodiments, the width of the rack units may be standardized. As an example, rack units 300A-C, may have a width of 19 inches. As another example, rack units, 300A-C, may have a width of 23 inches. In some embodiments, the frame of rack units 300A-C may be used to form an enclosure around the server component housed within the frame. In some embodiments, the frame may be fabricated using aluminum, steel, etc. For example, metal or plastic panels may be attached to the frame of rack units 300A-C to form an enclosure for the corresponding server component.

Server rack 306 may include mounting posts (not shown) on the front side or back side of server rack 306 to provide mechanical support for rack units 300A-C. For example, server rack 306 may have four posts that includes a pair of posts on the front side of server rack 306 and a mirrored pair of rear mounting posts on the back side of server rack 306. The mounting posts include a number of mounting holes that may be tapped to receive a particular type of threaded bolt. For example, the mounting holes may be tapped with alternating spacings of 1.25 inches and 0.5 inches. In cases where mounting posts are too thin to tap, rack units 300A-C, may be mounted using rivnuts or other threaded fasteners.

The mounting posts of server rack 306 may use clearance-holes, e.g., round hole, round unthreaded holes, Versa rail, etc., that are large enough to permit a bolt to be freely inserted through the mounting holes without binding. The bolts may be fastened in place using fasteners such as cage nuts. In some embodiments, networking components may be mounted to server rack 306 using rack units 300A-C. In some embodiments, rack units 300B-C may be front mounted to server rack 306 such that the front of rack units 300B-C corresponds to the front side of server rack 306 and the back side of rack units 300B-C correspond to the back side of server rack 306. In other embodiments, rack units 300A may be rear mounted to server rack 306 such that the front of rack units 300A correspond to the back side of server rack 306 and the back side of rack units 300A face the front side of server rack 306.

In some embodiments, rack units 300A-C are mechanically supported by rails (not shown) of server rack 306, and rack units 300A-C may be moved into and out of server rack 306 along the rails. Server components may be placed within server rack 306 using rack units 300A-C supported by the rails and fastened to the front or rear mounting posts. The rails may be configured to support the rack unit in a position that is outside server rack 306, e.g., through sliding rails, such that the server components mounted in the rack unit may be inspected or maintained. For example, the rails supporting rack units 300A-C may be locked in position to prevent rack units 300A-C from moving when extended out from server rack 306 for inspection or maintenance. For example, server rack 306 may have locking pins that drop into holes of the rails to hold rack units 300A-C in position. After inspection or maintenance is performed on the server component, rack unit 300A-C may be placed back in its mounted position within server rack 306.

Server components may be mounted in server racks 306 in a configuration that draws cool air from the front side of server rack 306 and exhaust the heated air through the back side of server rack 306. In other words, the server components may be mounted such that fans of the server component pull in cool air from the cold aisle located at the front side of server rack 306 and over the electronics of the server components. The fans of the server component may then exhaust the heated air through the back side of server rack 306. In some embodiments, a cool air zone is formed at the front portion of server rack 306 and a hot air zone may be formed at a back portion of server rack 306. For example, temperatures in the hot air zone may reach as high as 70° C. It is appreciated that there may be a continuous temperature gradient between the temperature of the hot air zone and temperature of the cool air zone of server rack 306.

Server components 300A-C may have different depths. For example, one or more server components 300A may have a depth that is less than the full depth of server rack 306. As an example, networking components, e.g., network switches, routers, etc., may have a depth that is less than the full depth of server rack 306 and, as described above, may be rear mounted in server rack 306. As described above, the network equipment may be mounted such that the port side of the network component is aligned with the back side of server rack 306 and configured to operate with a reverse air flow, such that air is exhausted through the back side of server rack 306.

In some embodiments, server components may be mounted within a rack unit 300A that includes a size adjustable conduit 304, as previously described in FIGS. 1 and 2. Rack unit 300A with size adjustable conduit 304 may be used for "new build" server systems as well as for "retro fit build" server systems. A "new build" server system refers to a situation where an empty server rack 306 is initially populated with server rack units 300A-C. In contrast, a "retro fit build" server system refers to the situation where only one rack unit is installed in a populated server rack 306. As described above, the dimensions of rack unit 300A may conform to an industry standard, such that rack unit 300A may be mounted in an available slot of server rack 306. In addition, for "retro fit build" server systems, rack unit 300A may be configured to perform non-intrusive maintenance procedures, e.g., removing/adding a PSU to a server component. For example, size adjustable conduit 304 may be retracted from its extended position to back into the frame of rack unit 300A, thereby allowing access to the server component for maintenance whilst remaining mounted to server rack 306. Once the maintenance is performed, size adjustable conduit 304 may be returned to its extended length.

Size adjustable conduit 304 may be fabricated using aluminum, steel, plastic, polyvinyl chloride (PVC), fiberglass, etc. The length of size adjustable conduit 304 may be adjusted such that size adjustable conduit 304 aligns with the front side of server rack 306, thereby preventing hot air and/or hot exhaust air created from server components mounted in adjacent rack units 300B-C from being drawn into rack unit 300A and eliminating hot air re-circulation. The length of size adjustable conduit 304 may be adjusted based on the size of the server component mounted in the frame of rack unit 300A. In some embodiments, the length of size adjustable conduit 304 may be adjusted so that the distal end of size adjustable conduit 304 aligns with the front side or back side of server rack 306. For example, the length of size adjustable conduit 304 may be adjusted such that the distal end of size adjustable conduit 304 of rear mounted rack unit 300 with a networking component is aligned with the back side of server rack 306. In this configuration, size adjustable conduit 304 defines a volume 302 through which the power side of the networking component is substantially thermally isolated from the hot air zone and air may be drawn in from a cold aisle described below. Herein, reference to thermal isolation may refer to a lack of thermal exchange, e.g., less than 1° C., between the air within volume 302 of size adjustable conduit 304 and the air of within the server rack.

As an example, a network switch may be used to connect server components in a server rack to a computing network, e.g., Internet, local area network (LAN), etc. The network switch may have network ports located on the front side. The network switch may be rear mounted to the server rack to facilitate establishing wired connections between network ports located on the back side of front mounted server components and network ports located on the front side of the network switch. It is common for a rear mounted network switch to operate with reverse air flow, such that cooling air is drawn in from the power side of the networking switch and exhausted from the port side of the networking switch. As described above, the depth of networking switches may be less deep than the depth of the server rack. For this reason, a rear mounted networking switch operating with reverse air flow may not have access to cooling air from outside the server rack and instead may draw in hot air from within the server rack.

Size adjustable conduit 304 of the rack unit that includes the rear mounted networking component may be extended, such that size adjustable conduit 304 thermally couples the air intake on the power side of the networking component to the cooling air located at the front side of the server rack.

Herein, reference to thermal coupling may refer to a state of substantial thermal equilibrium, e.g., within 2° C., of the air within volume 302 of size adjustable conduit 304 and the air of a cold aisle adjacent to the front side of the server rack. The cool air adjacent the front side of the server rack may be drawn in to the power side of the networking component through volume 302, where the cooling air absorbs the heat generated by the networking component through convection. The heated air is then exhausted through the power side of the networking component and out the back side of the server rack.

For example, size adjustable conduit 304 of a rear mounted networking component may be fixed in position by fastening the distal end of size adjustable conduit 304 to the mounting posts on the front side of server rack 306. In one instance, the rails may include a locking mechanism to hold size adjustable conduit 604 in place. For example, a locking mechanism may be a spring-loaded peg that locks into a hole in the rails, thereby holding size adjustable conduit 304 in an extended position relative to the back side of the server component. In another instance, size adjustable conduit 304 may be extended relative to the back side of the server component and held in place through the use of positioning screws that are inserted into holes in the rails.

With size adjustable conduit 304 aligned to front side of server rack 306 and a networking component operating in a reverse air flow configuration, air may be drawn in from the front side of server rack 306 to the back side of the frame of rack unit 300A and exhausted through the back side of server rack 306. In other words, when extended to align with the front side of server rack 306, a volume 302 of size adjustable conduit 304 serves to thermally couple the back side of the frame of the rack unit to the cold aisle. Volume 302 may be defined by the length and width of size adjustable conduit 304, as well as the length of size adjustable conduit 304 is extended. In some embodiments, volume 302 defined by size adjustable conduit 304 may be a rectangular-cuboid volume.

In some embodiments, size adjustable conduit 304 may be directly mounted to the server component. As example, size adjustable conduit 304 may be mounted to the back side of the server component using mounting holes in the server component normally used to fasten rails or brackets. For instance, size adjustable conduit 304 may be mounted to a server component using L-shaped brackets or rack ears fastened to the mounting holes of the server component. As another example, size adjustable conduit 304 may be fastened to mounting brackets that extend beyond the back side of the server component.

Figure 4:
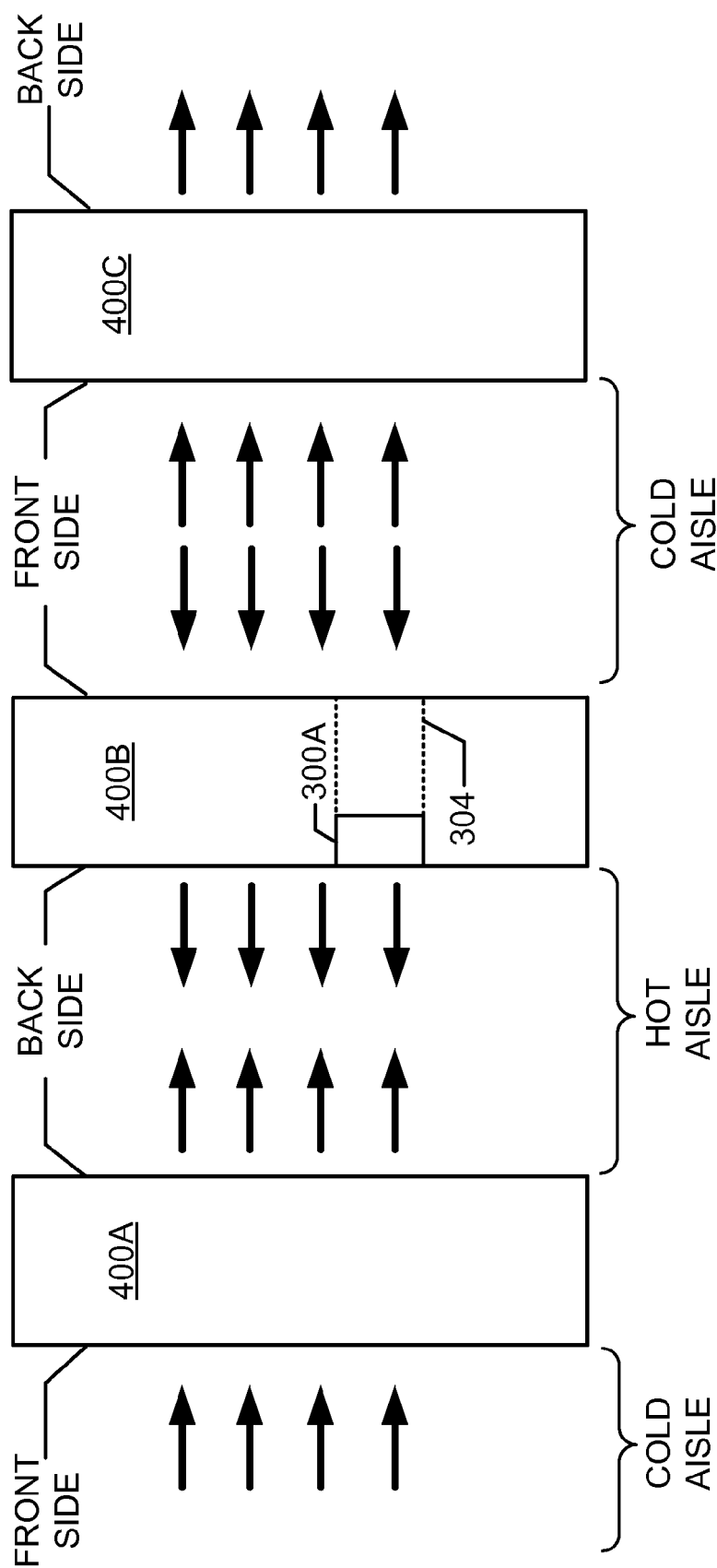
FIG. 4 illustrates a server rack with a rack unit according to some embodiments.

FIG. 4 illustrates a multiple server rack configuration according to some embodiments. As described above, a server computing system within a data center may include server components that are mounted in a number of server racks. Server racks may be arranged in a linear fashion in the form of side-by-side rows 400A-C. Rows 400A-C of server racks may be configured with the front side of the server racks and their front mounted components facing the same direction, which would provide a consistent airflow direction throughout rows 400A-C of server racks. However, if parallel rows 400A-C of server racks are placed with the same orientation, the hot exhaust air from the first row 400A of server racks gets sucked into the "cool" air intakes of the second row 400B of server racks. With each progressive row of server racks, the air temperature increases as hot air is passed from one row of server racks to the next.

In some embodiments, rows of server racks 400A-C may be located such that the front side of a server rack in an adjacent row of server racks, e.g., 400A-B, face each other and the back side of each server rack in another adjacent row of server racks, e.g., 400B-C, face each other. This arrangement of rows of server racks 400A-C may have a hot aisle formed from the exhaust of hot air from a pair of rows, e.g., 400A-B, of server racks with back sides that face each other and a cold aisle formed from the air inlet of a pair of rows, e.g., 400B-C, of server racks with front sides that face each other. In this configuration, air from the cold aisle is used to cool the electronics of rows 400A-C of server racks and the heated air from rows 400A-C of server racks is exhausted to the hot aisle.

This configuration of rows 400A-C of server racks into hot aisles and cold aisles is intended to prevent cool/exhaust air mixing within a multiple server rack configuration. The use of hot aisles and cold aisles may be a part of a configuration of server racks within a server room. The temperature environment of the server components may be maintained by the transfer of heat from server component using a gas, e.g. air, carbon dioxide, helium, etc., that flows through the channel and the cool aisle. The gas in the channel is thermally coupled to the cold aisle, such that there is a substantially thermal equilibrium, e.g., within 2° C., between the gas in the channel and the cold aisle. In other words, the gas in the channel provides a thermally conductive pathway between the server component and the cold aisle. As described above, a networking component may be rear mounted within a server rack using a rack unit with a size adjustable conduit. A volume defined by size adjustable conduit provides a channel through which air may be drawn in from the cold aisle to the power side of the networking component and the heated air exhausted to the hot aisle through the port side of the networking component.

In addition, air conditioners, fans, or raised floors may also be used as part of a cooling infrastructure. In some embodiments, computer room air conditioners (CRACs) or computer room air handlers (CRAHs) may be positioned around the perimeter of the server room or at the end of hot-aisles. CRAHs may push cold air under the raised floor and through the cold aisle. In other embodiments, perforated raised floor tiles may be placed in the cold aisle to concentrate cool air to the front of rows 400A-C of server racks. The sizing of the hot and cold aisles formed between rows 400A-C of server racks may be configured to ensure optimal cooling and heat dissipation.

In some embodiments, a containment structure may be used to contain either the cold air of the cold aisle or the hot air of the hot aisle. For example, a containment structure may be placed over rows, e.g., 400B-C, of server racks that form the cold aisle. As another example, a containment structure may be placed over rows, e.g., 400A-B, of server racks. In both cases, the containment structure is configured to prevent intermixing of the air of the cold aisle and the hot aisle. Use of containment structures increases efficiency of the same or less cooling infrastructure of the server room.

As such, provided herein is an apparatus that includes a frame with one or more brackets coupled to a front side of the frame. As an example, the brackets may be configured to mount the frame to a server rack. The apparatus also includes a conduit coupled to the back side of the frame. Furthermore, the frame may be mounted to the server rack using one or more fasteners inserted through the brackets. The conduit is configured to adjustably extend from the back side of the frame. For example, the conduit may be adjustably extendable from the back side of the frame to the front side of the server rack. The conduit is configured to substantially thermally isolate air within the conduit from air within the server rack. In some embodiments, the frame is mounted to a back side of the server rack using the brackets.

The conduit may define a substantially rectangular-cuboid volume. As an example, the server component is mounted to the frame such that a port side of the server component substantially aligns with the back side of the server rack. In some embodiments, the conduit includes one or more sleeve elements nested within the frame and each sleeve element is configured to extend in a direction away from the back side of the frame. In other embodiments, the conduit includes a number of rails that are coupled to the frame and one or more panels coupled to the rails. For example, the panels may be mounted on the rails by one or more positioning screws. The conduit may be configured such that when the conduit is extended to the adjustable distance a channel is formed between air at the front side of the server rack to the back side of the server component, such that air within the conduit is thermally isolated from air within the server rack.

Also provided herein is an apparatus that includes a frame and a conduit that is coupled to a back side of the frame. The conduit is configured to adjustably extend from the frame, thereby providing a channel between the back side of the frame and a side of the server rack. Furthermore, the channel is configured to substantially thermally isolate a flow of gas through the channel. In some embodiments, the apparatus may also include one or more brackets with mounting holes that are configured to align with mounting holes of a back side of the server rack. In some instances, the conduit includes a sleeve element that is configured to extend to the front side of the server rack that is adjacent to a cooling aisle. In other instances, the conduit includes a panel that is configured to extend to a front side of the server rack that is adjacent to the cooling aisle. Furthermore, the panel may be mounted on a number of rails by one or more positioning screws. A depth of the frame and the conduit may correspond to a depth of the server rack. A volume may be defined between the front side of the server rack and the back side of the frame when the conduit is extended.

Also provided herein is an apparatus that includes a frame configured for mounting within a first server rack and means for thermally isolating a first volume of gas within the frame from a second volume of gas within the first server rack. In some embodiments, the means may include a conduit that is coupled to the back side of the frame. Furthermore, the conduit may include one or more nested sleeve elements that are configured to extend an adjustable distance from the back side of the frame. In other embodiments, the means may include a conduit that is coupled to the back side of the frame. Furthermore, the conduit may include one or more panels mounted on a number of rails. The panels may be configured to extend an adjustable distance from the back side of the frame. The means may be configured to span a distance between the back side of the frame and a front side of the first server rack. The means are configured to thermally couple the back side of the frame to an aisle between the first server rack and a second server rack.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

What is claimed is:

1. An apparatus comprising:
a frame with one or more brackets coupled to a front side of the frame and an air intake on the front side of the frame, wherein the brackets are configured to mount the frame to a side of a server rack; and
a conduit coupled to a back side of the frame for extending within the server rack, defining a volume within the frame and conduit for air flow, wherein the conduit is configured to adjustably extend from the frame, and substantially thermally isolate air within the conduit from air within the server rack.

2. The apparatus as described in claim 1, wherein the frame is configured to be mounted to the front side of the server rack using the brackets.

3. The apparatus as described in claim 2, wherein the conduit is adjustably extendable from the frame to an air intake of a server component mounted at a side of the server rack.

4. The apparatus as described in claim 3, wherein the conduit is further configured such that a channel is formed between air at the front side of the server rack to the back side of the server component.

5. The apparatus as described in claim 4, wherein the conduit defines a two dimensional (2D) cross-section of the frame corresponding to a two-dimensional cross section of the server component.

6. The apparatus as described in claim 1, wherein a server component is mounted to the frame such that a front side of the server component substantially aligns with a back side of the server rack.

7. The apparatus as described in claim 1, wherein the conduit comprises one or more sleeve elements nested within the frame and each sleeve element is configured to extend in a direction away from the frame.

8. The apparatus as described in claim 1, wherein the conduit comprises:
a plurality of rails coupled to the frame; and
one or more panels coupled to the rails and mounted on the rails by one or more positioning screws.

9. The apparatus as described in claim 1, wherein the frame is mounted to the server rack using one or more fasteners inserted through the brackets.

10. An apparatus comprising:
a frame including an air intake on a front side of the frame; and
a size adjustable conduit extendable from the frame to an air intake of a server component in a server rack and defining a volume within the frame and the size adjustable conduit, thereby providing a channel between a front side of the server rack to a back side of the server rack, wherein the channel isolates gas within the channel from gas within the server rack.

11. The apparatus as described in claim 10 further comprising one or more brackets with mounting holes configured to align with mounting holes of a back side of the server rack.

12. The apparatus as described in claim 10, wherein the front side of the server rack is adjacent a cooling aisle, and wherein the channel is defined between the front side of the server rack and the back side of the server rack when the conduit is extended.

13. The apparatus as described in claim 10, wherein a front side of the server rack is adjacent a cooling aisle, and wherein the size adjustable conduit comprises a sleeve element.

14. The apparatus as described in claim 10, wherein the size adjustable conduit comprises:
a panel mounted on a plurality of rails by one or more positioning screws.

15. The apparatus as described in claim 10, wherein a depth of the frame, the size adjustable conduit, and the server component correspond to a depth of the server rack.

16. An apparatus comprising:
   a frame; and
   a conduit extending from the frame, wherein the frame is configured for mounting within a first server rack at a front side of the server rack such that the conduit is extendable from the frame towards a back side of the first server rack;
   wherein the conduit thermally isolates a first volume of gas within the conduit from a second volume of gas within the first server rack.

17. The apparatus as described in claim 16, wherein the conduit is size adjustable and comprises one or more nested sleeve elements that are configured to extend an adjustable distance from the frame.

18. The apparatus as described in claim 16, wherein the conduit is size adjustable and comprises one or more panels mounted on a plurality of rails, and wherein the panels are configured to extend an adjustable distance from the frame.

19. The apparatus as described in claim 16, wherein the conduit is size adjustable is configured to span a distance between the frame and a server component.

20. The apparatus as described in claim 16, wherein the conduit is size adjustable and is thermally coupled to an aisle between the first server rack and a second server rack.

* * * * *